United States Patent
Lei et al.

(10) Patent No.: US 9,947,578 B2
(45) Date of Patent: Apr. 17, 2018

(54) METHODS FOR FORMING LOW-RESISTANCE CONTACTS THROUGH INTEGRATED PROCESS FLOW SYSTEMS

(71) Applicant: APPLIED MATERIALS, INC., Santa Clara, CA (US)

(72) Inventors: Yu Lei, Foster City, CA (US); Vikash Banthia, Mountain View, CA (US); Kai Wu, Palo Alto, CA (US); Xinyu Fu, Pleasanton, CA (US); Yi Xu, San Jose, CA (US); Kazuya Daito, Milipitas, CA (US); Feiyue Ma, Sunnyvale, CA (US); Pulkit Agarwal, Santa Clara, CA (US); Chi-Chou Lin, San Jose, CA (US); Dien-Yeh Wu, San Jose, CA (US); Guoqiang Jian, San Jose, CA (US); Wei V. Tang, Santa Clara, CA (US); Jonathan Bakke, Sunnyvale, CA (US); Mei Chang, Saratoga, CA (US); Sundar Ramamurthy, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/358,690

(22) Filed: Nov. 22, 2016

(65) Prior Publication Data

US 2017/0148670 A1     May 25, 2017

Related U.S. Application Data

(60) Provisional application No. 62/260,094, filed on Nov. 25, 2015.

(51) Int. Cl.
*H01L 21/4763*    (2006.01)
*H01L 21/768*    (2006.01)
(Continued)

(52) U.S. Cl.
CPC .... *H01L 21/76843* (2013.01); *C23C 16/0227* (2013.01); *C23C 16/0281* (2013.01);
(Continued)

(58) Field of Classification Search
None
See application file for complete search history.

(56) References Cited

U.S. PATENT DOCUMENTS

| | | | |
|---|---|---|---|
| 5,429,989 | A | 7/1995 | Fiordalice et al. |
| 6,893,915 | B2 | 5/2005 | Park et al. |

(Continued)

OTHER PUBLICATIONS

International Search Report and Written Opinion dated Feb. 20, 2017 for PCT Application No. PCT/US2016/063321.

*Primary Examiner* — Bradley K Smith
(74) *Attorney, Agent, or Firm* — Moser Taboada; Alan Taboada

(57) ABSTRACT

Methods for forming metal contacts having tungsten liner layers are provided herein. In some embodiments, a method of processing a substrate includes: exposing a substrate, within a first substrate process chamber, to a plasma formed from a first gas comprising a metal organic tungsten precursor gas or a fluorine-free tungsten halide precursor to deposit a tungsten liner layer, wherein the tungsten liner layer is deposited atop a dielectric layer and within a feature formed in a first surface of the dielectric layer of a substrate; transferring the substrate to a second substrate process chamber without exposing the substrate to atmosphere; and exposing the substrate to a second gas comprising a tungsten fluoride precursor to deposit a tungsten fill layer atop the tungsten liner layer.

19 Claims, 3 Drawing Sheets

(51) Int. Cl.
*C23C 16/44* (2006.01)
*C23C 16/455* (2006.01)
*C23C 16/46* (2006.01)
*C23C 16/52* (2006.01)
*H01L 21/311* (2006.01)
*C23C 16/02* (2006.01)
*C23C 16/04* (2006.01)
*C23C 16/06* (2006.01)
*C23C 16/08* (2006.01)
*C23C 16/505* (2006.01)
*C23C 16/54* (2006.01)

(52) U.S. Cl.
CPC ............ *C23C 16/045* (2013.01); *C23C 16/06* (2013.01); *C23C 16/08* (2013.01); *C23C 16/4401* (2013.01); *C23C 16/45536* (2013.01); *C23C 16/45544* (2013.01); *C23C 16/46* (2013.01); *C23C 16/505* (2013.01); *C23C 16/52* (2013.01); *C23C 16/54* (2013.01); *H01L 21/31116* (2013.01); *H01L 21/76802* (2013.01); *H01L 21/76877* (2013.01)

(56) References Cited

U.S. PATENT DOCUMENTS

| | | | |
|---|---|---|---|
| 7,595,263 B2* | 9/2009 | Chung | C23C 16/02 257/E21.171 |
| 7,964,505 B2 | 6/2011 | Khandelwal et al. | |
| 9,070,749 B2 | 6/2015 | Kang | |
| 2011/0233778 A1 | 9/2011 | Lee et al. | |
| 2014/0030889 A1 | 1/2014 | Chen et al. | |
| 2014/0120723 A1* | 5/2014 | Fu | H01L 21/28506 438/680 |
| 2015/0294906 A1* | 10/2015 | Wu | H01L 21/76877 438/653 |

\* cited by examiner

… (1) …

METHODS FOR FORMING LOW-RESISTANCE CONTACTS THROUGH INTEGRATED PROCESS FLOW SYSTEMS

CROSS-REFERENCE TO RELATED APPLICATIONS

This application claims benefit of U.S. provisional patent application Ser. No. 62/260,094, filed Nov. 25, 2015, which is herein incorporated by reference in its entirety.

FIELD

Embodiments of the present disclosure generally relate to methods of processing substrates.

BACKGROUND

Traditional metal contact formation consists of an underlying metal layer, a tungsten liner layer, and a chemical vapor deposition (CVD) tungsten layer which are all typically processed in separated systems. As a result, the tungsten liner layer is exposed to the atmosphere after deposition and before deposition of the following CVD tungsten layer. The oxygen and moisture in the atmosphere oxidizes the top surface of tungsten liner layer and forms an oxide layer of typically 10 to 20 angstroms.

The oxidized portion of the liner layer material typically has a very high resistivity, for example greater than about 1E3 µOhm-cm, while the un-oxidized liner layer material resistivity is typically below 1E3 µOhm-cm. Therefore, the existence of the oxide portion of the liner layer will cause some additional resistance to the metal contact.

The subsequently deposited CVD tungsten layer is formed on the top surface of the liner layer. The incubation delay of the CVD tungsten layer will vary depending on the surface film properties of the liner layer. An oxide film causes more delays than unoxidized or partially oxidized films. In addition the incubation delay can vary between the field region of a substrate and within a feature (e.g. a via or a trench) resulting in voids or large seams during a CVD tungsten gap fill process. The presence of such voids or large seams will result in even higher contact resistance and poor reliability.

As the feature size of an integrated circuit continues shrinking, especially for contact structures (e.g. a trench or via) at the 20 nm level, the contributions towards contact resistance from the oxidized liner material will be significantly increased and cause high contact resistances, which will limit the device driving current and deteriorate the device performance. In addition, the incubation delay variation can cause severe gap fill problems, such as voids, resulting in poor reliability as well as high resistance.

Thus, the inventors have provided improved methods for metal contact formation having tungsten liner layers.

SUMMARY

Methods for forming metal contacts having tungsten liner layers are provided herein. In some embodiments, a method of processing a substrate includes: exposing a substrate, within a first substrate process chamber, to a plasma formed from a first gas comprising a metal organic tungsten precursor gas or a fluorine-free tungsten halide precursor to deposit a tungsten liner layer within a first substrate process chamber, wherein the tungsten liner layer is deposited atop a dielectric layer and within a feature formed in a first surface of the dielectric layer of a substrate; transferring the substrate to a second substrate process chamber without exposing the substrate to atmosphere; and exposing the substrate to a second gas comprising a tungsten fluoride precursor to deposit a tungsten fill layer atop the tungsten liner layer.

In some embodiments, a method of processing a substrate includes: exposing the substrate to a tungsten hexafluoride ($WF_6$) gas at a temperature of about 200 to about 400 degrees Celsius or to a hydrogen ($H_2$) gas at a temperature of about 300 to about 500 degrees Celsius for about 0.5 to about 600 seconds; exposing a substrate, within a first substrate process chamber, to a plasma formed from a first gas comprising a metal organic tungsten precursor gas or a fluorine-free tungsten halide precursor to deposit a tungsten liner layer, wherein the tungsten liner layer is deposited atop a dielectric layer and within a feature formed in a first surface of the dielectric layer of a substrate; transferring the substrate to a second substrate process chamber without exposing the substrate to atmosphere; and exposing the substrate to a second gas comprising a tungsten fluoride precursor to deposit a tungsten fill layer atop the tungsten liner layer.

In some embodiments, a computer readable medium is provided having instructions stored thereon that, when executed, causes a process chamber to perform a method of processing a substrate. The method may include any of the methods disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1:
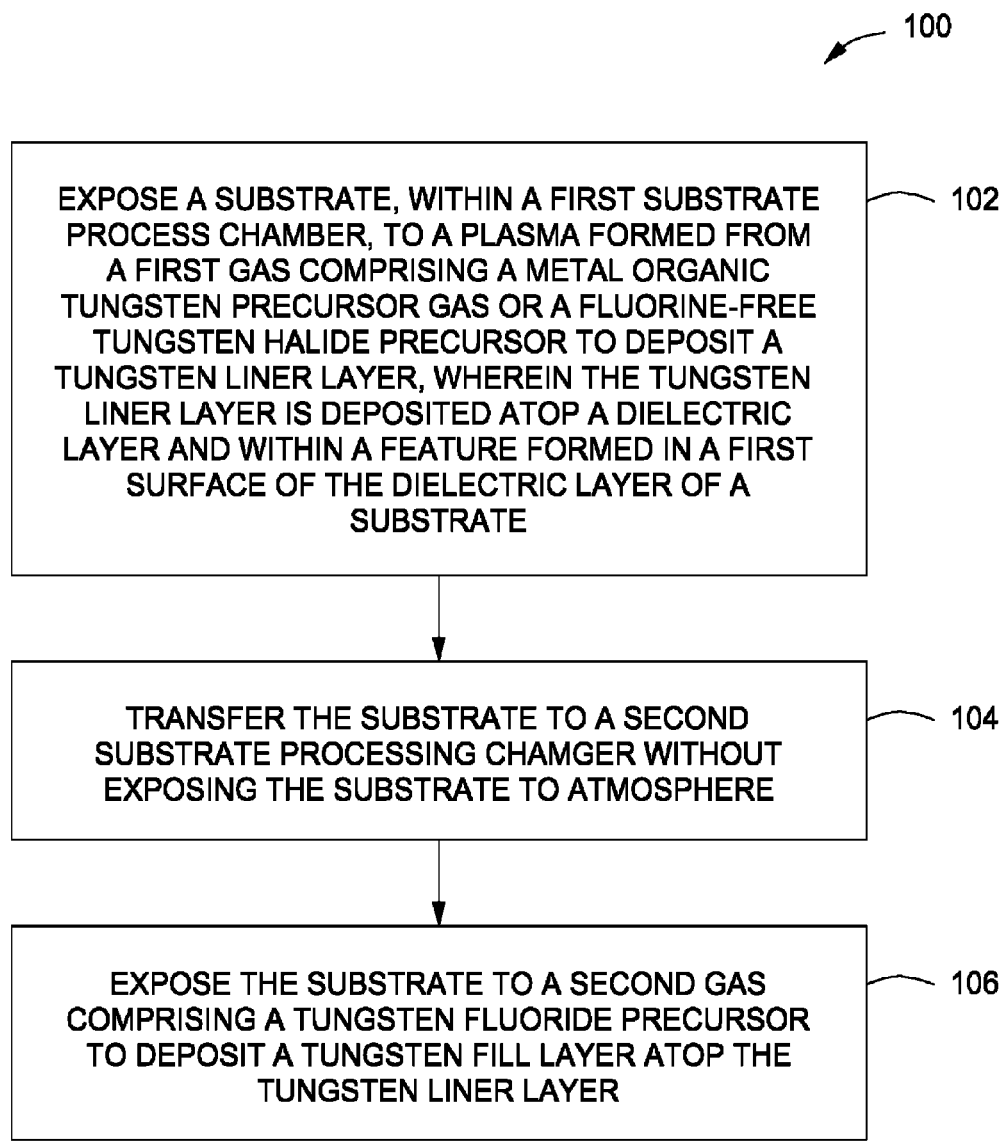
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. The elements and features of one embodiment may be beneficially incorporated in other embodiments without further recitation.

DETAILED DESCRIPTION

Methods for forming metal contacts having tungsten liner layers are provided herein. The inventive methods described herein may advantageously be used to facilitate formation of improved metal contacts, vias, and gates by avoiding oxidation of the tungsten liner layer to avoid both high contact resistance and poor gap fill. By avoiding oxidation of the tungsten liner layer the thickness of the liner can be reduced leading to reduced contact resistance and increased space for the following CVD tungsten gap fill, which reduces the risk of voids or larger seams and improves device reliability.

The inventive methods described herein may be utilized with any device nodes, but may be particularly advantageous in device nodes of about 10 nm or less. A "liner layer," as used herein, may refer to a layer conformably formed along at least a portion of the sidewalls and/or lower surface of a feature such that a substantial portion of the feature prior to the deposition of the layer remains unfilled after deposition of the layer. In some embodiments, the liner layer may be formed along the entirety of the sidewalls and lower surface of the feature.

FIG. 1 depicts a flow chart of a method 100 for forming a metal contact in accordance with some embodiments of the present disclosure. The method 100 may be performed in any suitable process chambers configured for one or more of chemical vapor deposition (CVD) or atomic layer deposition (ALD), such as plasma enhanced ALD or thermal ALD (i.e. no plasma formation). Exemplary processing systems that may be used to perform the inventive methods disclosed herein may include, but are not limited to, those of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including those from other manufacturers, may also be suitably used in connection with the teachings provided herein.

Figure 2A:
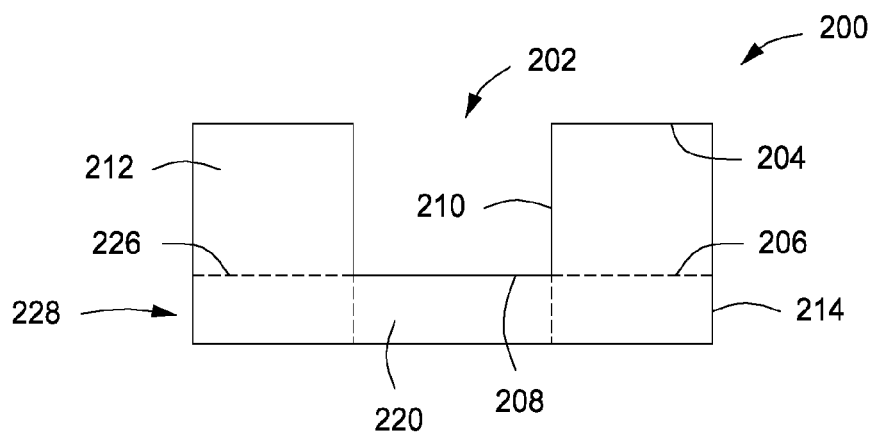
FIGS. 2A-2C depict a side cross-sectional view of an interconnect structure formed in a substrate in accordance with some embodiments of the present disclosure.

The method 100 may be performed on a substrate 200, as depicted in FIG. 2A, having a feature 202 formed in a first surface 204 of the substrate 200 and extending into the substrate 200 towards an opposing second surface 206 of the substrate 200. The substrate 200 may be any substrate capable of having material deposited on the substrate 200, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate, such that the tungsten liner layer, as described below, may be at least partially formed on the substrate. For example, in some embodiments, a layer comprising a metal, a nitride, an oxide, or the like, or combinations thereof may be disposed on the substrate and may have the tungsten layer formed upon such layer or layers.

The substrate 200 may be any suitable substrate having a feature 202 formed in the substrate. For example, the substrate 200 may comprise one or more of a dielectric material, silicon (Si), metals, or the like. In addition, the substrate 200 may include additional layers of materials or may have one or more completed or partially completed structures formed on or in the substrate 200. For example, the substrate 200 may include a first dielectric layer 212, such as silicon oxide, a low-k material (e.g., a material having a dielectric constant less than silicon oxide, or less than about 3.9), or the like. The feature 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., conductive material 220) may be disposed in the second dielectric layer 214 and may be aligned with the feature 202 such that the feature 202, when filled with a conductive material, provides an electrical path to and from the conductive material. For example, the conductive material may be part of a line or plug to which the interconnect is coupled.

The feature 202 may be any opening, such as a via, trench, dual damascene structure, or the like. In some embodiments, the feature 202 may have a high aspect ratio, e.g., an aspect ratio of about 1:1 or more. As used herein, the aspect ratio is the ratio of a depth of the feature to a width of the feature. The feature 202, as depicted in FIG. 2A, may be formed by etching the first dielectric layer 212 using any suitable etch process. The feature 202 includes a bottom surface 208 and sidewalls 210.

Figure 2B:
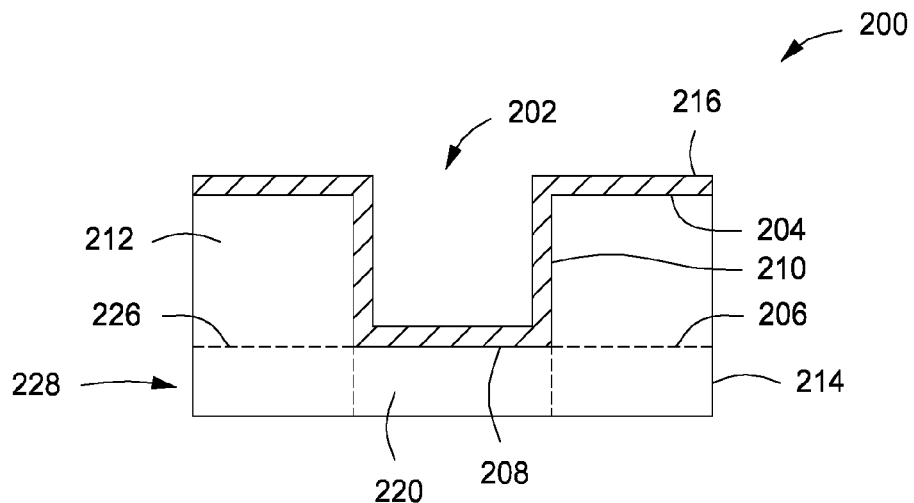
Figure 2C:
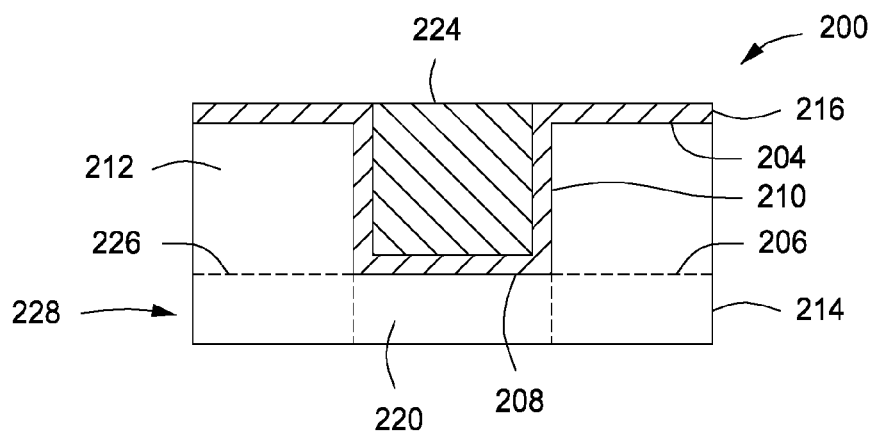

In some embodiments, and as illustrated by dotted lines in FIGS. 2A-2C, the feature 202 may extend completely through the first dielectric layer 212 and an upper surface 226 of a second substrate 228 and may form the bottom surface 208 of the feature 202. The second substrate 228 may be disposed adjacent to the second surface 206 of the substrate 200. Further (and also illustrated by dotted lines), a conductive material (e.g., conductive material 220), for example as part of a device, such as a logic device or the like, or an electrical path to a device requiring electrical connectivity, such as a gate, a contact pad, a conductive line or plug, or the like, may be disposed in the upper surface 226 of the second substrate 228 and aligned with the feature 202.

At 102, and as depicted in FIG. 2B, a tungsten liner layer 216 is deposited atop the first dielectric layer 212 and within the feature 202 formed in the first surface 204 of the first dielectric layer 212 of the substrate 200. For example, the sidewalls 210 of the feature 202, the bottom surface 208 of the feature 202, and the first surface 204 of the substrate 200 may be covered by the tungsten liner layer 216.

In some embodiments, the tungsten liner layer 216 is formed by exposing the substrate 200 to plasma formed from a first gas. In some embodiments, the first gas comprises a metal organic tungsten precursor gas. In some embodiments, the first gas comprises a fluorine free tungsten halide precursor, such as tungsten pentachloride ($WCl_5$) or tungsten hexachloride ($WCl_6$). In some embodiments, the first gas further comprises a reactant gas, such as a hydrogen containing gas, such as hydrogen ($H_2$) or ammonia ($NH_3$), and a carrier gas, such as argon, helium, or nitrogen, along with the tungsten precursor gas. The carrier gas is an inert gas. In some embodiments, the first gas consists of, or consists essentially of, a metal organic tungsten precursor gas, a reactant gas, and a carrier gas. In some embodiments, the first gas consists of, or consists essentially of a fluorine free tungsten halide precursor, a hydrogen containing gas, and an inert gas. The presence of hydrogen in the first gas advantageously minimizes the presence of carbon impurities in the tungsten liner layer 216. The carrier gas is provided at a flow rate of about 100 sccm to about 3000 sccm.

The tungsten liner layer 216 serves as a suitable surface for a subsequent formation of the tungsten fill layer described below and may also serve to prevent diffusion of a subsequently deposited metal layer into underlying layers, such as first dielectric layer 212. The tungsten liner layer 216 may have any thickness suitable to adhere to the underlying layer and to facilitate the formation the tungsten fill layer described below. For example, in some embodiments, the tungsten liner layer 216 may have a thickness of about 10 to about 50 angstroms. The reduced thickness of the tungsten liner layer 216 can increase the throughput of the process flow system.

In some embodiments, suitable metal organic tungsten precursors may include precursors having the chemical formula $W(A)(B)_2(C)$, or $W(A)(B)_3(D)$, or $W(B)_6$, or $W(A)_2$ (D)$_2$, or W(B)$_{6-x}$(B2)$_x$, or W(E)$_4$, or W(F)$_3$, or W(F)$_2$(B)$_2$, or W(F)(B)$_4$, where A is a negatively charged 6 electron donor, B is a neutral 2 electron donor, C is a positively charged 2 electron donor, D is a negatively charged 2 electron donor, E is a negatively charged 4 electron donor, F is a neutral 4 electron donor, and x is a positive integer from 0 to 6. Examples of suitable precursors include W(CO)$_6$, CpW(CO)$_2$NO. EtCpW(CO)$_2$NO, Cp*W(CO)$_3$NO, Cp$_2$WH$_2$, C$_4$H$_9$CNW(CO)$_5$, (C$_5$H$_{11}$CN)W(CO)$_5$, W(C$_3$H$_5$)$_4$, W(C$_3$H$_4$CH$_3$)$_4$, W(C$_4$H$_6$)$_3$, W(C$_4$H$_6$)$_2$(CO)$_2$, or W(C$_4$H$_6$)(CO)$_4$.

In some embodiments, the tungsten liner layer 216 is formed within a first process chamber such as a plasma enhanced chemical vapor deposition process chamber (PECVD) or a plasma enhanced atomic layer deposition process (PEALD) chamber wherein the substrate 200 is exposed to the tungsten precursor in a plasma state. The plasma may be formed by coupling sufficient energy, for example radio frequency (RF) energy from a power source to ignite the first gas to form the plasma. In some embodiments, the power source may illustratively provide about 50 W to about 1.2 kW, of power at a suitable frequency, such as about 13.56 MHz. The plasma facilitates a decomposition of the precursors, causing a deposition of material on the substrate 200 to form the tungsten liner layer 216.

General processing conditions for forming the tungsten liner layer 216 discussed above includes maintaining a suitable process chamber pressure and temperature for deposition of the tungsten liner layer 216. For example, in some embodiments, the process chamber is at a pressure of about 0.5 to about 40 Torr. In some embodiments, the temperature of the process chamber during formation of the tungsten liner layer 216 is about 125 to about 425 degrees Celsius.

In some embodiments, prior to depositing the tungsten liner layer 216 deposited atop the first dielectric layer 212 and within the feature 202 formed in the first surface 204 of the first dielectric layer 212 of the substrate 200 as described at 102 above, a pre-clean process is performed to remove oxidized material from the surface of any underlying metal layer (e.g., conductive material 220). The most common pre-clean process is plasma based, using high-energy argon ions or argon ions mixed with hydrogen ions to bombard the metal oxide. However, the high-energy ions also bombard dielectric atoms or molecules and remove some dielectric material, which can change the shape of the trenches or vias significantly, for example, by forming an overhang, which leads to voids in a subsequent gap fill process and therefore high contact resistance. The inventors have observed that a pre-clean process based on selective chemical reaction, especially where tungsten or cobalt is present as an underlying metal layer, advantageously reduces or prevents altering the shape of the trenches or vias. The pre-clean process introduces (1) tungsten hexafluoride (WF$_6$) gas to the substrate 200 surface at a temperature of about 200 to about 400 degrees Celsius, or (2) hydrogen (H$_2$) gas to the substrate 200 surface at an elevated temperature of about 300 to about 500 degrees Celsius. The substrate is exposed to the tungsten hexafluoride (WF$_6$) gas or the hydrogen (H$_2$) gas for about 0.5 to about 600 seconds. In embodiments where tungsten and cobalt is present as the underlying conductive material 220, the oxide can be tungsten oxide (WO$_x$) (e.g. WO$_3$) or cobalt oxide (CoO$_x$) (e.g. CoO$_2$). At temperatures as described above, the tungsten oxide reacts with the tungsten hexafluoride (WF$_6$) according to the following reaction: WO$_3$+2 WF$_6$-->3 WOF$_4$ (gas). At temperatures as described above, the cobalt oxide reacts with the tungsten hexafluoride (WF$_6$) according to the following reaction: CoO$_2$+WF$_6$--> CoOF$_2$ (gas)+WOF$_4$ (gas). At temperatures as described above, the tungsten oxide reacts with hydrogen (H$_2$) gas according to the following reaction: WO$_3$+6H$_2$-->W+6H$_2$O (gas). At temperature as described above, the cobalt oxide reacts with hydrogen (H$_2$) gas according to the following reaction: CoO$_2$+2H$_2$-->Co+2H$_2$O (gas). The introduced pre-clean gas (i.e., either the tungsten hexafluoride (WF$_6$) gas or the hydrogen (H$_2$) gas) will not react with the dielectric materials, such as silicon oxide (SiO$_2$) and silicon nitride (Si$_3$N$_4$) at temperatures up to about 500 degrees Celsius. Thus, the pre-clean process advantageously limits or prevents structural changes (caused by ion bombardment) and limits or prevents overhang formation, which can lead to a void-free gapfill process with improved yield.

Next, at 104, the substrate 200 is transferred from the first chamber to a second process chamber without exposing the substrate to atmosphere. The inventors have observed that exposure to oxygen and moisture in the atmosphere oxidizes the top surface of the tungsten liner layer 216 and forms an oxide layer having a thickness of about 10 to about 20 angstroms. The inventors have observed that the presence of the oxide portion of the tungsten liner layer 216 increases the resistance of the metal contact. In addition, the inventors have observed that the presence of the oxide portion of the tungsten liner layer 216 increases the incubation delay in forming the tungsten fill layer as described at 106 below. The incubation delay results in the formation of voids or large seams during the deposition of the tungsten fill layer. Thus, the inventors have observed that avoiding oxidation of the tungsten liner layer 216 advantageously prevents increased resistance of the metal contact and prevents formation of voids and seams in the metal contact.

Next, at 106, and as depicted in FIG. 2C, a tungsten fill layer 224 is deposited over the tungsten liner layer 216 to fill the feature 202. The tungsten fill layer 224 may be deposited by a chemical vapor deposition process using a tungsten fluoride precursor. For example, in some embodiments, the tungsten fill layer 224 may be deposited by a chemical vapor deposition process using a tungsten fluoride precursor such as tungsten hexachloride (WF$_6$) or a combination of tungsten hexachloride (WF$_6$) and a hydrogen containing gas such as hydrogen (H$_2$) or ammonia (NH$_3$). In some embodiments, prior to deposition of the tungsten fill layer 224, a tungsten nucleation layer is deposited atop the tungsten liner layer 216. In some embodiments, the nucleation layer is deposited via an atomic layer deposition process where the substrate 200 is cyclically exposed to a tungsten precursor gas, such as tungsten hexachloride (WCl$_6$), and a reducing gas such as silane or diborane. In some embodiments, the thickness of the nucleation layer is about 15 to about 20 angstroms.

The feature 202 may be filled above the level of the upper surface of the substrate 200 and the deposited material (e.g., tungsten liner layer 216) and the tungsten fill layer 224 may remain on the upper surface of the substrate 200. Accordingly, techniques, such as wet clean in an acidic solution, chemical or electrochemical mechanical polishing, or the like may be used to remove excess deposited material from the upper surface, such that the feature 202 is filled with the deposited conductive material up to about an equivalent level with the upper surface of the substrate, as depicted in FIG. 2C.

Figure 3:
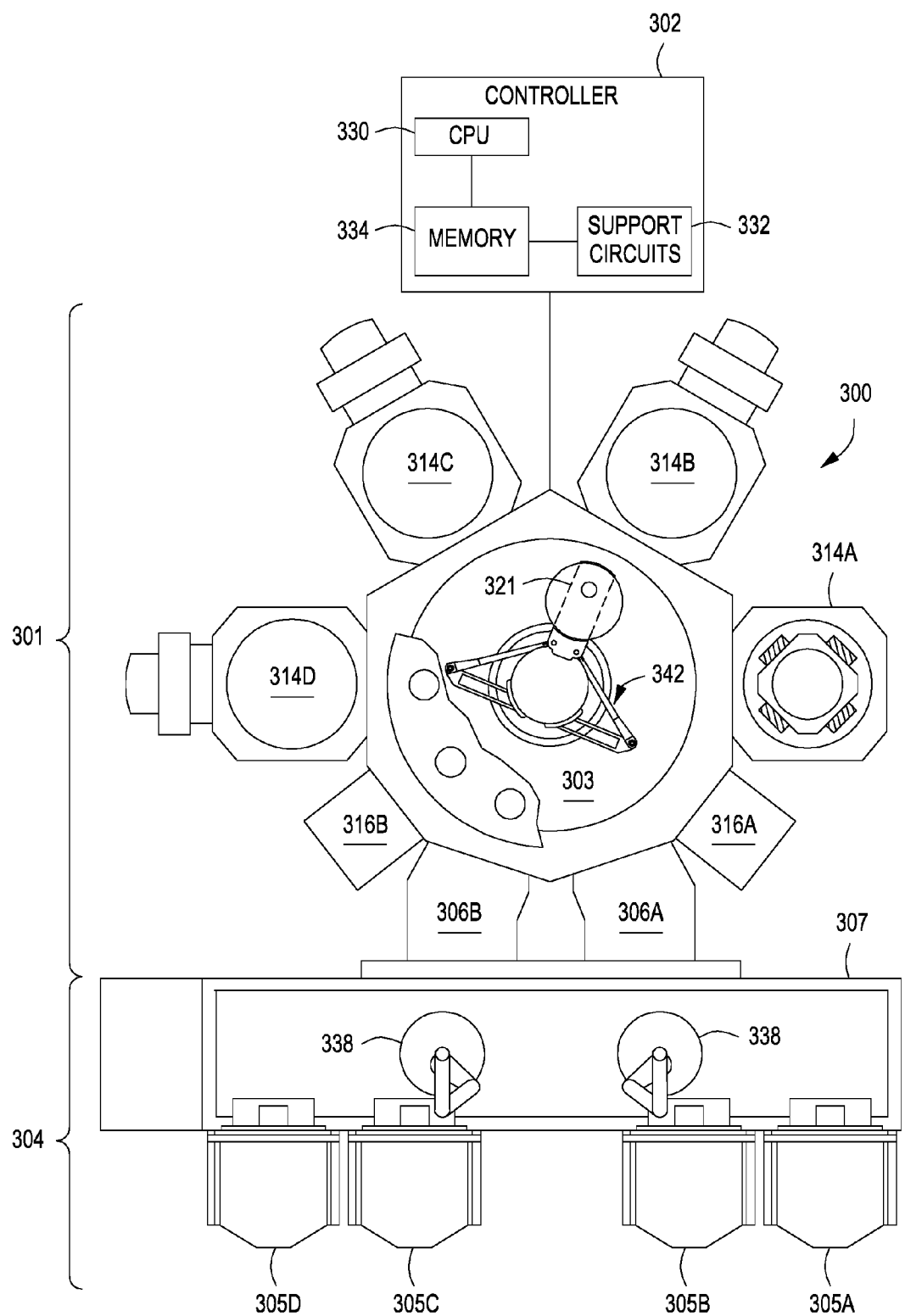
FIG. 3 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA® and ENDURA® and PRO- DUCER® line of integrated tools, available from Applied Materials, Inc., of Santa Clara, Calif. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g. oxidation) of the tungsten liner layer or other portions of the substrate.

The integrated tool 300 includes a vacuum-tight processing platform (processing platform 301), a factory interface 304, and a system controller 302. The processing platform 301 comprises multiple process chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed within the transfer chamber 303. The vacuum robot 342 is capable of transferring substrates 321 between the load lock chamber 306A and 306B and the process chambers 314A, 314B, 314C, and 314D.

In some embodiments, the process chambers 314A, 314B, 314C, and 314D, are coupled to the transfer chamber 303. The process chambers 314A, 314B, 314C, and 314D comprise at least a plasma enhanced atomic layer deposition (PEALD) chamber, and a chemical vapor deposition (CVD) chamber. Additional chambers may also be provided such as additional CVD chambers and/or annealing chambers, a physical vapor deposition (PVD) chamber, degassing chambers, pre-cleaning chamber, a CVD chamber with seam suppression function or the like. CVD and annealing chambers may include any of those suitable to perform all or portions of the methods described herein, as discusses above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a central processing unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as processing methods as described above may be stored in the memory 334 and, when executed by the CPU 330, transform the CPU 330 into a specific purpose computer (system controller 302). The software routines may also be stored and/or executed by a second controller (not shown) that is located remotely from the tool 300.

In some embodiments, a typical process flow for the method 100 in an integrated tool 300 may include transferring the substrate 200 from a FOUP to a factory interface robot to a loadlock chamber to a degas chamber to a pre-clean chamber to a tungsten liner layer deposition chamber, such as a CVD or PEALD chamber, to a tungsten fill layer deposition chamber, such as a CVD or ALD chamber, to a cooling chamber to the loadlock chamber to the factory interface to the FOUP.

In some embodiments, a typical process flow for the method 100 in an integrated tool 300 may include transferring the substrate 200 from a FOUP to a factory interface robot to a loadlock chamber to a pre-clean chamber to a tungsten liner layer deposition chamber, such as a CVD or PEALD chamber, to a tungsten fill layer deposition chamber, such as a CVD or ALD chamber, to the loadlock chamber to the factory interface to the FOUP.

In some embodiments, a typical process flow for the method 100 in an integrated tool 300 may include transferring the substrate 200 from a FOUP to a factory interface robot to a loadlock chamber to a tungsten liner layer deposition chamber, such as a CVD or PEALD chamber, to a tungsten fill layer deposition chamber, such as a CVD or ALD chamber, to the loadlock chamber to the factory interface to the FOUP. In some embodiments, the loadlock can be used as cooling chambers. In some embodiments, the tungsten liner deposition chamber can also perform pre-cleaning processes. In some embodiments, the tungsten liner deposition chamber can also be used to deposit additional suitable interconnect layers such as metal-oxide chemical vapor deposition (MOCVD) titanium nitride (TiN) using tetrakis(dimethylamido)titanium (TDMAT), or atomic layer deposition (ALD) TiN using titanium tetrachloride ($TiCl_4$), or titanium silicon nitride (TiSiN), or titanium aluminum nitride (TiAlN), or titanium chloride (TiC) or titanium aluminum chloride (TiAlC), or CVD TiN using $TiCl_4$, or TiSiN or TiAlN or TiC or TiAlC, ALD tantalum nitride (TaN) or tantalum silicide (TaSi) or tantalum silicon nitride (TaSiN).

While the foregoing is directed to embodiments of the present disclosure, other and further embodiments may be devised without departing from the basic scope thereof.

The invention claimed is:

1. A method of processing a substrate, comprising:
exposing a substrate, within a first substrate process chamber, to a plasma formed from a first gas comprising a metal organic tungsten precursor gas or a fluorine-free tungsten halide precursor to deposit a tungsten liner layer, wherein the tungsten liner layer is deposited atop a dielectric layer and within a feature formed in a first surface of the dielectric layer of a substrate;

transferring the substrate to a second substrate process chamber without exposing the substrate to atmosphere;

exposing the substrate to a second gas comprising a tungsten fluoride precursor to deposit a tungsten fill layer atop the tungsten liner layer; and exposing the substrate to a tungsten hexafluoride ($WF_6$) gas at a temperature of about 200 to about 400 degrees Celsius prior to depositing the tungsten liner layer or to a hydrogen ($H_2$) gas at a temperature of about 300 to about 500 degrees Celsius prior to depositing the tungsten liner layer.

2. The method of claim 1, wherein the tungsten liner layer has a thickness of about 10 to about 50 angstroms.

3. The method of claim 1, wherein the first gas further comprises a hydrogen-containing gas.

4. The method of claim 3, wherein the hydrogen-containing gas is hydrogen ($H_2$), or ammonia ($NH_3$).

5. The method of claim 1, wherein the first gas further comprises a carrier gas.

6. The method of claim 5, wherein the carrier gas is argon, helium, or nitrogen.

7. The method of claim 6, wherein a flow rate of the carrier gas is about 100 sccm to about 600 sccm.

8. The method of claim 1, wherein the metal organic tungsten precursor gas is $W(CO)_6$, $CpW(CO)_2NO$, $EtCpW(CO)_2NO$, $Cp*W(CO)_3NO$, $Cp_2WH_2$, $C_4H_9CNW(CO)_5$, $(C_5H_{11}CN)W(CO)_5$, $W(C_3H_5)_4$, $W(C_3H_4CH_3)_4$, $W(C_4H_6)_3$, $W(C_4H_6)_2(CO)_2$, or $W(C_4H_6)(CO)_4$.

9. The method of claim 1, wherein the first substrate process chamber is at a pressure of about 0.5 Torr to about 40 Torr.

10. The method of claim 1, wherein the tungsten fluoride precursor is tungsten hexafluoride ($WF_6$).

11. The method of claim 1, wherein the fluorine-free tungsten halide precursor is tungsten pentachloride ($WCl_5$) or tungsten hexachloride ($WCl_6$).

12. The method of claim 1, wherein the second gas further comprises a hydrogen containing gas.

13. The method of claim 12, wherein the hydrogen containing gas is hydrogen ($H_2$) or ammonia ($NH_3$).

14. The method of claim 1, further comprising exposing the substrate to the tungsten hexafluoride ($WF_6$) gas or the hydrogen ($H_2$) gas for about 0.5 to about 600 seconds.

15. A method of processing a substrate, comprising:

exposing the substrate to a tungsten hexafluoride ($WF_6$) gas at a temperature of about 200 to about 400 degrees Celsius or to a hydrogen ($H_2$) gas at a temperature of about 300 to about 500 degrees Celsius for about 0.5 to about 600 seconds;

exposing a substrate, within a first substrate process chamber, to a plasma formed from a first gas comprising a metal organic tungsten precursor gas or a fluorine-free tungsten halide precursor to deposit a tungsten liner layer, wherein the tungsten liner layer is deposited atop a dielectric layer and within a feature formed in a first surface of the dielectric layer of a substrate;

transferring the substrate to a second substrate process chamber without exposing the substrate to atmosphere; and exposing the substrate to a second gas comprising a tungsten fluoride precursor to deposit a tungsten fill layer atop the tungsten liner layer.

16. The method of claim 15, wherein the metal organic tungsten precursor gas is W(CO)6, CpW(CO)2NO, EtCpW(CO)2NO, Cp*W(CO)3NO, Cp2WH2, C4H9CNW(CO)5, (C5H11CN)W(CO)5, W(C3H5)4, W(C3H4CH3)4, W(C4H6)3, W(C4H6)2(CO)2, or W(C4H6)(CO)4.

17. The method of claim 15, wherein the tungsten fluoride precursor is tungsten hexafluoride (WF6).

18. The method of claim 15, wherein the fluorine-free tungsten halide precursor is tungsten pentachloride ($WCl_5$) or tungsten hexachloride ($WCl_6$).

19. A computer readable medium, having instructions stored thereon which, when executed, cause a process chamber to perform a method of processing a substrate, the method comprising:

exposing the substrate to a tungsten hexafluoride ($WF_6$) gas at a temperature of about 200 to about 400 degrees Celsius or to a hydrogen ($H_2$) gas at a temperature of about 300 to about 500 degrees Celsius for about 0.5 to about 600 seconds;

exposing a substrate, within a first substrate process chamber, to a plasma formed from a first gas comprising a metal organic tungsten precursor gas or a fluorine-free tungsten halide precursor to deposit a tungsten liner layer, wherein the tungsten liner layer is deposited atop a dielectric layer and within a feature formed in a first surface of the dielectric layer of a substrate;

transferring the substrate to a second substrate process chamber without exposing the substrate to atmosphere; and exposing the substrate to a second gas comprising a tungsten fluoride precursor to deposit a tungsten fill layer atop the tungsten liner layer.

* * * * *